United States Patent
Ciraula et al.

[19]

[11] Patent Number: 6,111,434

[45] Date of Patent: Aug. 29, 2000

[54] CIRCUIT HAVING ANTI-CHARGE SHARE CHARACTERISTICS AND METHOD THEREFORE

[75] Inventors: Michael Kevin Ciraula, Round Rock; David James Martens; Robert Paul Masleid, both of Austin, all of Tex.

[73] Assignee: International Business Machines Corporation, Armonk, N.Y.

[21] Appl. No.: 08/897,577

[22] Filed: Jul. 21, 1997

[51] Int. Cl.[7] .................................................. H03K 19/096
[52] U.S. Cl. ............................. 326/98; 326/28; 326/121
[58] Field of Search .............................. 326/95–98, 112, 326/119, 121, 17, 27–28

[56] References Cited

U.S. PATENT DOCUMENTS

| | | | |
|---|---|---|---|
| 4,797,580 | 1/1989 | Sunter ........................................ | 326/98 |
| 4,985,643 | 1/1991 | Proebsting . | |
| 5,065,048 | 11/1991 | Asai et al. . | |
| 5,483,181 | 1/1996 | D'Souza .................................... | 326/98 |
| 5,525,916 | 6/1996 | Gu et al. .................................... | 326/98 |
| 5,553,029 | 9/1996 | Reohr et al. ............................. | 365/208 |
| 5,661,675 | 8/1997 | Chin et al. ................................ | 326/98 |
| 5,793,228 | 8/1998 | Evans ....................................... | 326/98 |
| 5,838,169 | 11/1998 | Schorn ..................................... | 326/98 |
| 5,838,170 | 11/1998 | Schorn ..................................... | 326/98 |

OTHER PUBLICATIONS

J.A. Pretorius et al., "Latched Domino CMOS Logic", Electronics Letters, Mar. 28, 1985, vol. 21, No. 7, pp. 263–264.

*Primary Examiner*—Jon Santamauro
*Attorney, Agent, or Firm*—Winstead Sechrest & Minick P.C.; Anthony V. S. England

[57] ABSTRACT

An anti-charge share device and method for operation ensure that charge share protection is provided for nodes in a logic circuit during an evaluate stage with low costs in terms of power and circuit performance. The anti-charge sharing device includes a transistor coupled between pre-charge node and a second node being evaluated. By coupling the charge share device between the pre-charge node and the node to be evaluated, operation of the charge share device is dependent upon a node which no longer requires a charge-sharing protection.

9 Claims, 5 Drawing Sheets

CIRCUIT HAVING ANTI-CHARGE SHARE CHARACTERISTICS AND METHOD THEREFORE

CROSS-REFERENCE TO RELATED, CO-PENDING APPLICATIONS

This application is related to the following patent applications, filed concurrently herewith and entitled:

"NMOS CHARGE-SHARING PREVENTION DEVICE FOR DYNAMIC LOGIC CIRCUITS" by Eric B. Schorn, Ser. No. 08/713,881, issued as U.S. Pat. No. 5,838,169; and "PMOS CHARGE-SHARING PREVENTION DEVICE FOR DYNAMIC LOGIC CIRCUITS" by Eric B. Schorn, Ser. No. 08/713,883, issued as U.S. Pat. No. 5,838,120.

TECHNICAL FIELD

The present invention is related in general to circuits having anti-charge share devices and, more particularly, to circuits having low-power anti-charge share devices.

BACKGROUND INFORMATION

The implementation of dynamic circuit topologies in modem microprocessors brings with it a series of technical challenges that must be overcome in order to show that the actual operation of the circuit matches the logical specification for that circuit. In situations where the details of the circuit have not been sufficiently managed, the actual operation of the device can be very different from the intended functionality. Typically, the areas for concern for a circuit designer include node leakage, input noise sensitivity, and charge share protection. To discuss each of these areas of concern, a description of a typical dynamic circuit will be subsequently provided.

Figure 1:
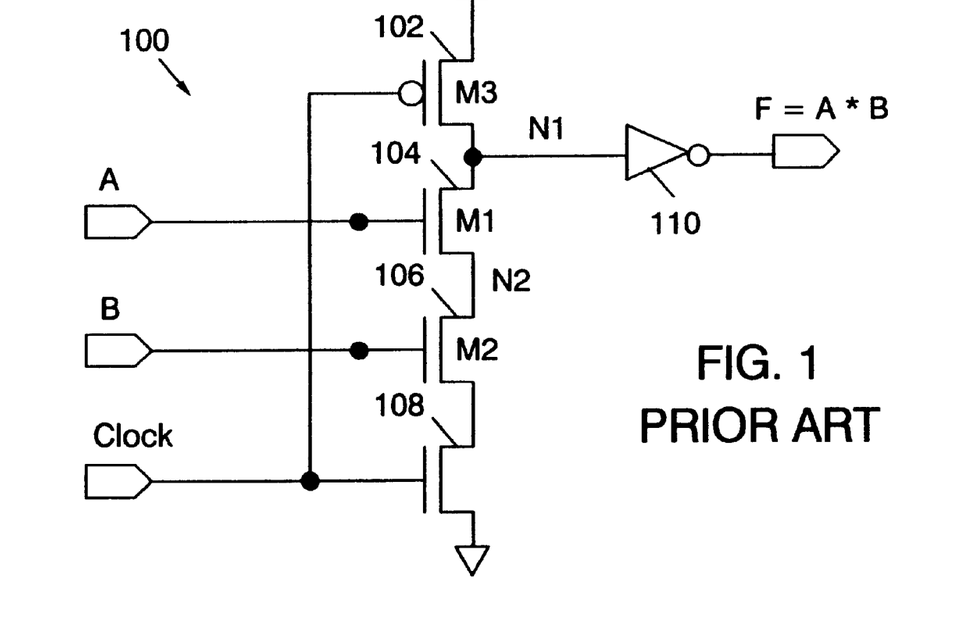
FIG. 1 illustrates, in circuit diagram form, a prior art implementation of a dynamic AND circuit.

FIG. 1 illustrates a standard dynamic circuit which implements a logical AND function (F=A*B). For a dynamic circuit such as that illustrated in FIG. 1, two functional phases must be executed correctly for the circuit to perform as desired. These two functional phases include a pre-charge phase and an evaluate phase. The evaluate phase is that portion of a processor clock cycle in which the circuit performs its desired logic function, and is defined by a clock signal having an active high voltage level. For instance, if a two-input AND gate is used to implement the logic function, F=A*B, the output "F" will properly represent that logic function only during the evaluate phase, since the output of the circuit can only be active high when a clock input has an active high level. The pre-charge phase is defined as the portion of the processor cycle that sets the clock signal to a low voltage level. The pre-charge time has the function of preparing the circuit for correct operation during the crucial evaluate phase by setting the voltage levels of internal nodes of the circuit to logic levels which will ensure correct functionality during the following evaluation stage. More specifically, the pre-charge phase will set the voltage on the internal nodes, such as N1 (illustrated in FIG. 1), to a logic high level. During the pre-charge phase, the voltage level on the internal nodes are set by a pull-up transistor M3 (102) that is active when the clock signal has a logic low value. Since the output of AND circuit 100 is the inverse of node N1, an output of AND circuit 100 will be a logic low during the pre-charge phase. When AND circuit 100 enters the evaluate phase, the clock signal will be active high, and the logic levels of inputs A and B will determine whether the internal node N1 is discharged to an electrical ground level. If node N1 transitions to a logic low value, the output of AND circuit 100 will be a logic high value, completing the generation of the intended logic function.

From this basic description of operation of dynamic AND circuit 100, several complications can be added to increase the design complexity of AND circuit 100 substantially. One such complication is derived from the fact that the voltage level set during the pre-charge phase on node N1 is not actively sustained during the evaluate phase since the clock signal will be a logic high level (by definition) during the evaluation phase. By providing the clock input at a high logic level on the gate of transistor (M3) 102, transistor (M3) 102 will be disabled from conducting electrical current. If input data A is at a logic low value, it may be observed that the conditions for transistor (M1) 104 and transistor (M3) 102 will combine to cause the voltage on node N1 to be controlled by secondary electrical effects. During the time in which node transistors actively control the voltage level of node N1, the voltage level on node N1 will be maintained by the node capacitance at that location. However, the material characteristics of the transistors involved in the design of AND circuit 100 will cause the electrical charge that has been stored on node N1 to leak away at a rate which will cause problems in the operation of this AND gate 100. If node N1 is allowed to drop in voltage to the level of the switching point of inverter 110, an improper output transition will occur. The transition is improper because it is not based on the value of input A and B, but is based only on a rate of decay of the voltage on internal node N1. Although several approaches may be used to solve this problem, the most common solution is the addition of a feed back transistor. Such a configuration is illustrated in FIG. 2.

Figure 2:
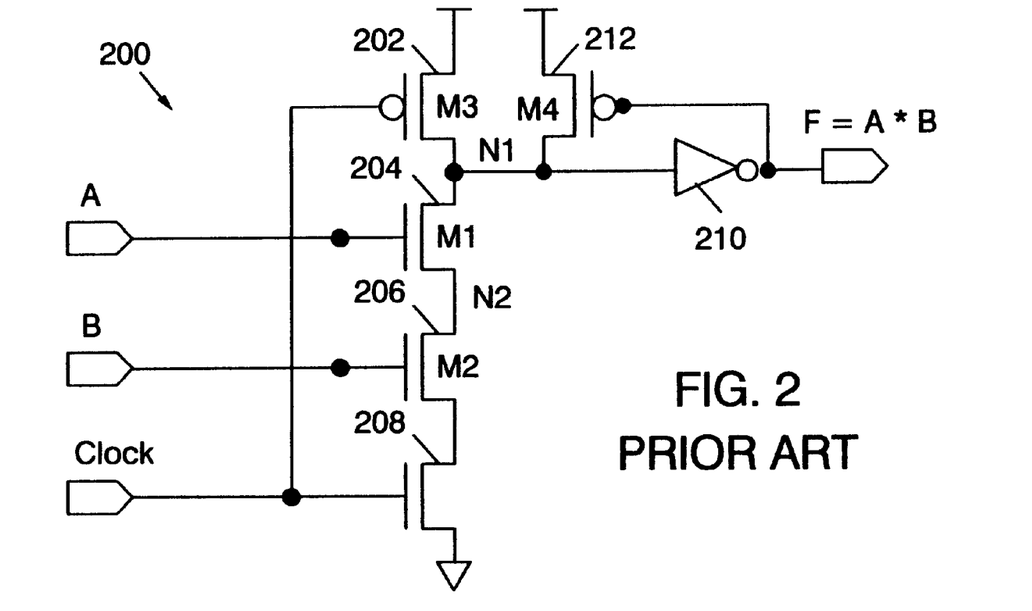
FIG. 2 illustrates, in circuit diagram form, a prior art implementation of a dynamic AND circuit having leakage protection.

In FIG. 2, the feedback transistor is transistor (M4) 212. Transistor (M4) 212 will offset any leakage current from the previously described mechanism and will, therefore, prevent invalid output transitions of that nature. Therefore, through the addition of transistor (M4) 212, the problem of leakage has been solved.

Figure 3A:
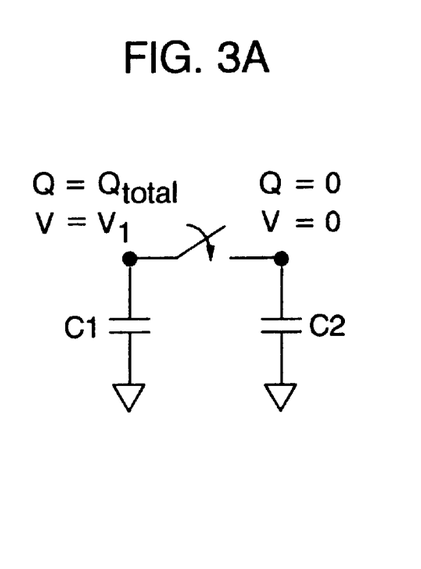

A second issue which faces dynamic circuit designs is that of charge share. As was previously mentioned, the voltage on node N1 is sustained by the capacitance of that node. Since this capacitance is formed, in part, by the diffusion of transistor (M1) 204, transistor (M3) 202, and transistor (M4) 212 implanted during processing steps, it may be understood that there will be some capacitance present on node N2 for the same reason. In addition, as was previously noted, a functional problem can occur when the voltage on node N1 is allowed to drop to a level near the switching threshold of the output inverter. By recognizing these two insights, another important circuit design consideration can be easily described. From basic electrical theory, it may be observed that when a charged capacitor and an uncharged capacitor are brought into parallel contact, there will be a redistribution of charge that will cause the final voltage on the two capacitors to be identical. This situation is illustrated in FIG. 3-A, which illustrates two capacitors (C1 and C2), connected by an electrical switch.

As is illustrated in FIG. 3-A, capacitor C1 has a voltage at V1 and capacitor C2 has a voltage of zero volts before the electrical switch is used to couple the two capacitors together. After the switch is closed, a final voltage for both capacitors (C1 and C2) will transition to a new value, $V_2$. From electrical theory, it may be illustrated that the value of $V_2$ can be found by using the following equation:

$$V_2 = \frac{Q_{total} * C1}{C1 + C2}, \text{ where } Q_{total} = V1 * C1. \qquad (1)$$

Figure 3B:
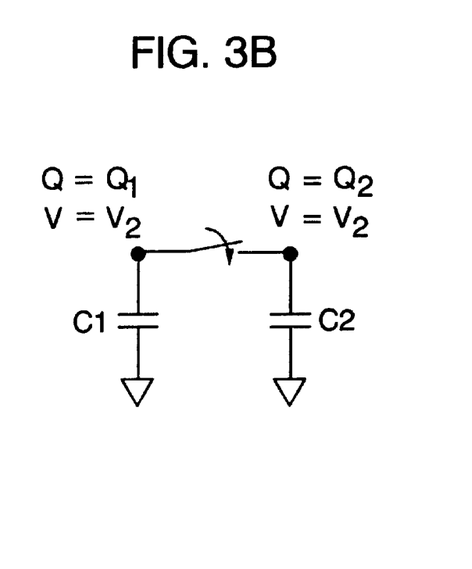

The resultant sharing of charge among capacitors C1 and C2 is illustrated in greater detail in FIG. 3-B. The situation illustrated in FIGS. 3-A and 3-B is similar in concept to the charge share problems that are routinely encountered by circuit designers. Specifically, the N1 node will be pre-charged to a high logic level and node N2 will have a voltage between $V_{DD}$ and an electrical ground value. If node N2 is at a voltage near zero volts, input A is active, and input B is inactive, a charge that has been stored in the capacitance on node N1 will be shared between nodes N1 and N2. Equation (1) provided above predicts a final voltage, V2, that will be present on nodes N1 and N2, when secondary effects are neglected. If the capacitance of node N2 is comparable to that of node N1, the voltage level on node N1 may drop below the switching threshold of the output inverter and cause an incorrect output transition. As with the previously described scenario, such charge sharing is unallowable because the output of AND circuit 200 will no longer be a proper representation of the input signals thereto. For this reason, a degree of charge sharing present in a circuit must be kept within a manageable range. It is worth noting that charge sharing cannot totally be eliminated without the addition of additional circuit elements.

While it is possible to use standard design techniques to minimize the node capacitance on node N2, and thereby minimize charge share, such techniques are only practical to the amount of benefit they will allow for proper operation of the circuits. Therefore, many circuit designers use additional design elements to ensure the voltage on node N2 (in this example) is substantially higher than the zero volt level used in the previous example. Typically, this requires the addition of a transistor that will also pre-charge the N2 node during the pre-charge phase of operation. An example of this circuit is illustrated in FIG. 4.

Figure 4:
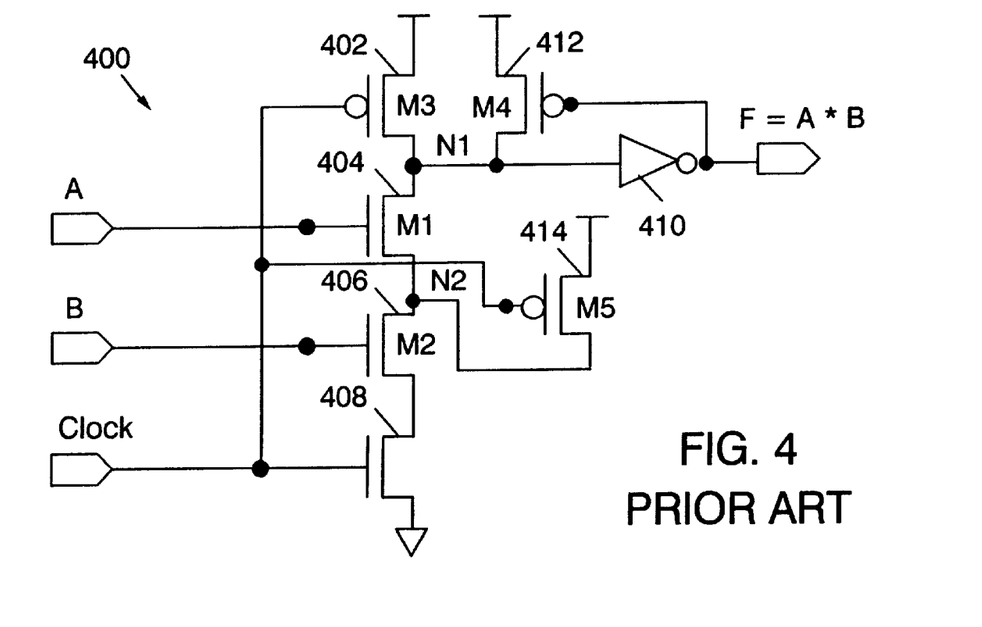
FIG. 4 illustrates, in circuit diagram form, a third configuration as a dynamic AND circuit having charge share protection.

AND circuit 400 of FIG. 4 effectively tackles the charge share problem. In FIG. 4, transistor (M5) 414 has been added to pre-charge node N2 and is used at the same time that node N1 is pre-charged to a logic high level. Of primary concern is the fact that the charge placed on node N2 by transistor (M5) 414 will be subject to leakage in the same manner that charge placed on node N1 by transistor (M3) 402 was subject to leakage in the earlier example. If the charge from node N2 leaks away during an evaluation phase when the Clock signal has disabled transistor (M5) 414, then the potential for charge sharing is as great as it would be without the addition of transistor (M5). In that case, little protection is offered by transistor (M5) 414. Furthermore, it should be noted that during high-temperatures, slow clock rate operation such as would be observed in a manufacturing test, the leakage on nodes N2 and N1 will be greatly increased. It should also be noted that the use of an n-channel device in such circuit implementations is superior to a p-channel device in terms of its effect on circuit evaluation time. However, the n-channel device still may have charged leakage concerns during the evaluation phase and must be driven by a clock signal. For this reason, the use of a single clock-gated device, whether n-channel or p-channel, is to be avoided.

Therefore, the fact that transistor (M5) 414 is enabled by the Clock signal presents serious operational concerns. It should be noted that while an AND circuit is illustrated in FIG. 4, this disadvantage also applies to other circuits implemented using a similar methodology. For these reasons, the circuit implementation illustrated in FIG. 4 provides insufficient charge share protection.

The solutions for circumventing the charge share issues described above have suffered from charge leakage problems related to the deactivation of such anti-charge sharing devices during the evaluation phase. It is possible to change a topology of circuits such as AND circuit 400 to allow the anti-charge sharing devices to be active during evaluation or during some other time period. It may be observed that activating the pre-charge devices, such as transistor (M5) 414, only during the evaluation phase will not provide sufficient time to pre-charge internal nodes, such as node N2, before an evaluation event occurs. Such an evaluation event will occur when input A or B transitions from one logic state to another. Because this alternative will not operate in a correct manner, this alternative will not be considered in greater detail. Additionally, a feedback loop with an inverter could be used for node N2, as was done with node N1. However, the cost of adding these circuit elements typically requires an increase in overhead which may be unacceptable. A remaining possibility is to implement a circuit which activates the anti-charge share device at all times. This would require implementing an n-channel or p-channel device (as illustrated in FIG. 5), so that the anti-charge share device conducts at all times.

Figure 5:
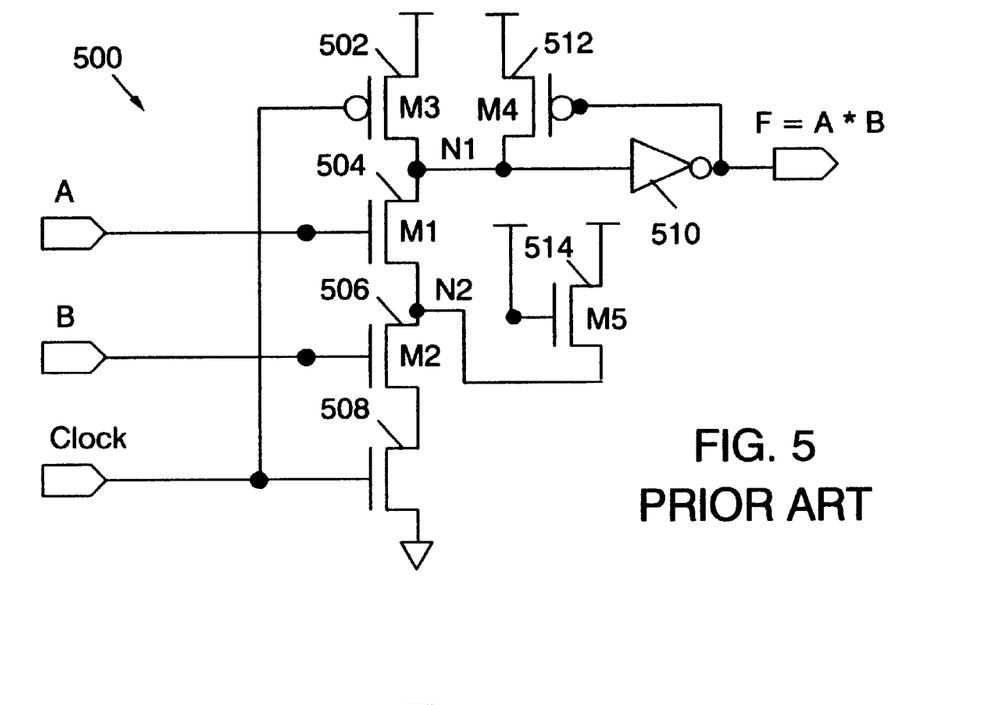
FIG. 5 illustrates, in circuit diagram form, an implementation and a prior art dynamic AND circuit having charge share protection.

As illustrated in FIG. 5, the previously described problem of charge leakage during the evaluation phase does not exist because transistor (M5) 514 will reinforce the voltage level on node N2. However, the use of transistor (M5) 514 in this manner significantly degrades performance for the following reasons. During operation, transistor (M5) 514 pulls node N2 to a high logic level. Then, transistor (M2) 506 and any other device below node N2 in the n-channel "stack" of AND circuit 500 will attempt to pull node N2 to a low logic level. This situation results in a significant DC power problem if this technique is used widely within a data processing system. The most serious concern for this implementation is that this circuit design is susceptible to a phenomena referred to as "data-dependent reset." When the following case is analyzed, it will become apparent why this issue is so significant.

In the following example, assume that AND circuit 500 is in an evaluation phase and inputs A and B are both at an active high level. It is to be noticed that the output of AND circuit 500 would also be an active high level. If, however, input B transitions to an inactive state, it is possible for transistor (M5) 514 to pull node N2 and node N1 to such a higher level such that voltage output inverter 510 of AND circuit 500 transitions to an inactive logic level. If the circuits that received the output of AND circuit 500 do not properly consider this possibility, a serious functional problem could be introduced by such an early reset operation. There might be a situation where AND circuit 500 fed one input of a second AND circuit, and this stage could evaluate a reset before the second input to the following stage was received. In such a situation, the second logic stage would suffer from improper functionality since both inputs were active during different portions of the evaluation phase, but the output of the second AND circuit did not transition to reflect this condition. Indeed, this is a serious problem, and the detection of this situation is not straightforward in all cases.

Figure 8:
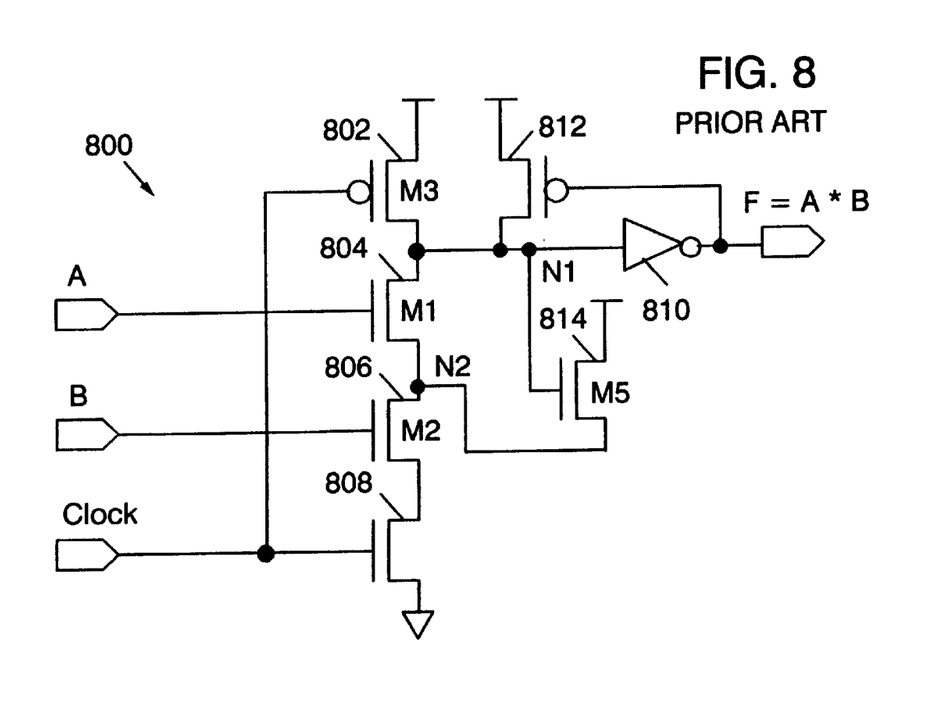
FIG. 8 illustrates, in circuit diagram form, a prior art implementation of a dynamic AND circuit.

FIG. 8 illustrates an alternate prior art implementation which provides some charge share protection in dynamic circuits. FIG. 8 illustrates an AND circuit 800 which is configured in accordance with one embodiment of the present invention. AND circuit 800 comprises a transistor 802, a transistor 804, a transistor 806, a transistor 808, an inverter 810, a transistor 812, and a transistor 814. A first terminal of transistor 802 is coupled to a first reference voltage. A second terminal of transistor 802 is coupled to receive a clock signal. A third terminal of transistor 802 is coupled to a first terminal of transistor 804, a first terminal of transistor 812, a first terminal of transistor 814, and an input of inverter 810. A second terminal of transistor 804 is coupled to receive the A input signal. A third terminal of transistor 804 is coupled to a first terminal of transistor 806 and a second terminal of transistor 814. It should be noted that the connection between transistors 804 and 806 forms the node N2. The B input signal is provided to a second terminal of transistor 806 and a third terminal of transistor 806 is coupled to a first terminal of transistor 808. The clock signal is coupled to a second terminal of transistor 808 and a third terminal of transistor 808 is coupled to a reference ground voltage. A third terminal of transistor 814 is coupled to the first reference voltage. An output of inverter 810 is coupled to a second terminal of transistor 812 and a third terminal of transistor 812 is coupled to the first reference voltage. Furthermore, the output of inverter 810 provides an output signal having the form: F=A*B.

FIG. 8 illustrates an alternate embodiment of a prior art AND circuit. In FIG. 8, assume that an external user is not concerned with a zero current of IDDQ test. In this situation, a charge sharing device is formed by transistor 814 alone. In this situation, a source of an anti-charge sharing device is coupled to a node which should be charge share protected. Therefore, in the embodiment of the invention illustrated in FIG. 8, a source of transistor 814 is coupled to node N2, as node N2 is the node which should be protected from charge sharing. In FIG. 8, as in FIG. 6, transistor 814 is a pre-charge type anti-charge share device. As with the embodiments of the invention illustrated in FIGS. 6 and 7, the anti-charge sharing device (transistor 814) is controlled directly or indirectly (through an inverter) by node N1. Therefore, transistor 814 will remain enabled as long as AND circuit 800 is in its pre-charged condition. Therefore, once AND circuit 800 has been prepared for evaluation, it is in its pre-charge condition and will be held therein by transistor 812 as node N1 is a logic high value. Furthermore, transistor 814 will remain enabled to keep node N2 charged for an indefinite period of time.

When node N2 is charged, node N1 can not be discharged by conduction through transistor 804, leakage into the substrate from node N2, or through leakage from transistor 806 when the B input signal is noisy.

While the description presented above provides an exhaustive description of charge share anomalies in dynamic logic circuits, it should be noted that similar issues are present in static circuits. Therefore, a need exists for a circuit and method for providing charge share protection in static and dynamic circuits which do not require significant amounts of power or significantly degrade circuit performance.

SUMMARY OF THE INVENTION

The previously mentioned needs are fulfilled with the present invention. Accordingly, there is provided, in a first form, an anti-charge share circuit. The anti-charge share circuit includes a logic circuit having an internal node and a pre-charge node. A first transfer device has a first terminal connected to a first reference value, a second terminal connected to the internal node, and a third terminal. The anti-charge share device also includes a second transfer device having a first terminal connected to the third terminal of the first transfer device, a second terminal connected to an enable input, and a third terminal connected to the pre-charge node.

Furthermore, there is provided, in a second form, a circuit including a dynamic logic circuit having an internal node and a pre-charge node. The circuit also includes a first transfer device which has a first terminal connected to a first reference value, a second terminal connected to the internal node, and a third terminal. Additionally, the circuit includes a second transfer device having a first terminal connected to the third terminal of the first transfer device, a second terminal connected to an enable signal, and a third terminal connected to the pre-charge node.

Additionally, there is provided, in a third form, a circuit including a static logic circuit having an internal node and a pre-charge node. The circuit also includes a first transfer device having a first terminal connected to a first reference value, a second terminal connected to the internal node, and a third terminal. Additionally, the circuit includes a second transfer device having a first terminal connected to the third terminal of the first transfer device, a second terminal connected to an enable input, and a third terminal connected to the pre-charge node.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 3-A illustrates a first capacitor configuration;

FIG. 3-B illustrates a second capacitor configuration;

DETAILED DESCRIPTION

Design of circuits, both static and dynamic, requires a circuit designer to consider the susceptibility of each circuit to the problem of charge share. Most circuit design solutions for the charge share problem fall within two categories: a circuit which provides very good charge share protection at a high cost in terms of power and circuit performance, or a circuit that has mediocre charge share protection at a lower cost in terms of power and circuit performance. The present invention describes a circuit and method which will provide the benefit of very good charge share protection, while bringing with it the lower cost associated with less-aggressive, anti-charge share prior art designs. The implementation of the present invention provides an effective solution to the charge share problem inherent in many designs, especially dynamic designs.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art. Additionally, during the following description of the implementation of the invention, the terms "assert" and "negate" and various grammatical forms thereof, are used to avoid confusion when dealing with a mixture of "active high" and "active low" logic serials. "Assert" is used to refer to the rendering of a logic signal or registered bit into its active, or logically true, state. "Negate" is used to refer to the rendering of a logic signal or registered bit into its inactive, or logically false state. Furthermore, in a following discussion, node N1 will be referred to as the "internal node" and node N2 will be referred to as the "pre-charge" node.

Refer now to the drawings wherein depicted elements are not necessarily shown to scale and wherein like or similar elements are designated by the same reference numerals within the several views. It should be noted that a general description of connectivity of the present invention will be provided before operation of the present invention is disclosed in greater detail.

Description of Connectivity

Figure 6:
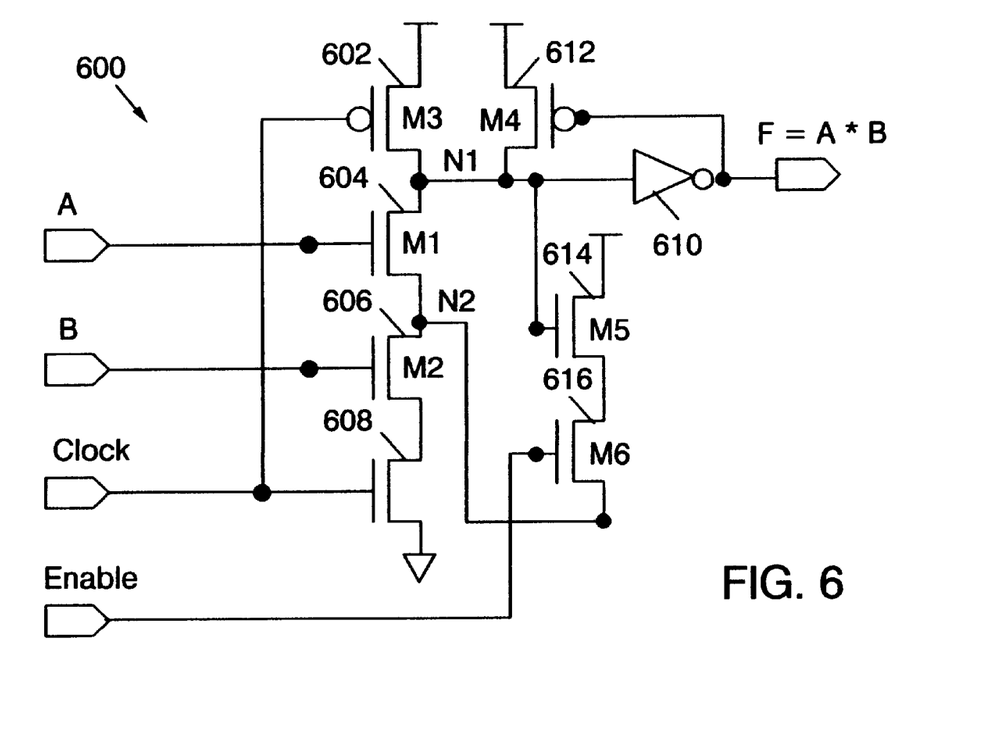
FIG. 6 illustrates, in circuit diagram form, a dynamic AND circuit in accordance with one embodiment of the present invention.

FIG. 6 illustrates an AND circuit 600 which implements an anti-charge sharing device in accordance with one embodiment of the present invention. AND circuit 600 comprises a transistor 602, a transistor 604, a transistor 606, a transistor 608, an inverter 610, a transistor 612, a transistor 614, and a transistor 616. A first terminal of transistor 602 is coupled to a first reference voltage. A second terminal of transistor 602 is coupled to a clock signal, a third terminal of transistor 604, a first terminal of transistor 612, a first terminal of transistor 614, and an input of inverter 610. The A input signal is provided to a second terminal of transistor 604. A third terminal of transistor 604 is coupled to a first terminal of transistor 606 and a first terminal of transistor 616. It should be noted that the connection between the third terminal of transistor 604 and the first terminal of transistor 606 forms node N2. A second terminal of transistor 606 is coupled to receive the B input signal. A third terminal of transistor 606 is coupled to a first terminal of transistor 608. The clock signal is coupled to a second terminal of transistor 608 and a third terminal of transistor 608 is coupled to a reference ground voltage. An Enable signal is coupled to a second terminal of transistor 616. A third terminal of transistor 616 is coupled to a second terminal of transistor 614. A third terminal of transistor 614 is coupled to a first reference voltage. An output of inverter 610 is coupled to a second terminal of transistor 612. A third terminal of transistor 612 is coupled to the first reference voltage. An output of inverter 610 provides an output signal which corresponds to: F=A*B. It should be noted that in one embodiment of the present invention, transistor 602 and transistor 612 are implemented as p-channel devices, while transistors 604, 606, 608, 614, and 616 are implemented as n-channel devices.

Figure 7:
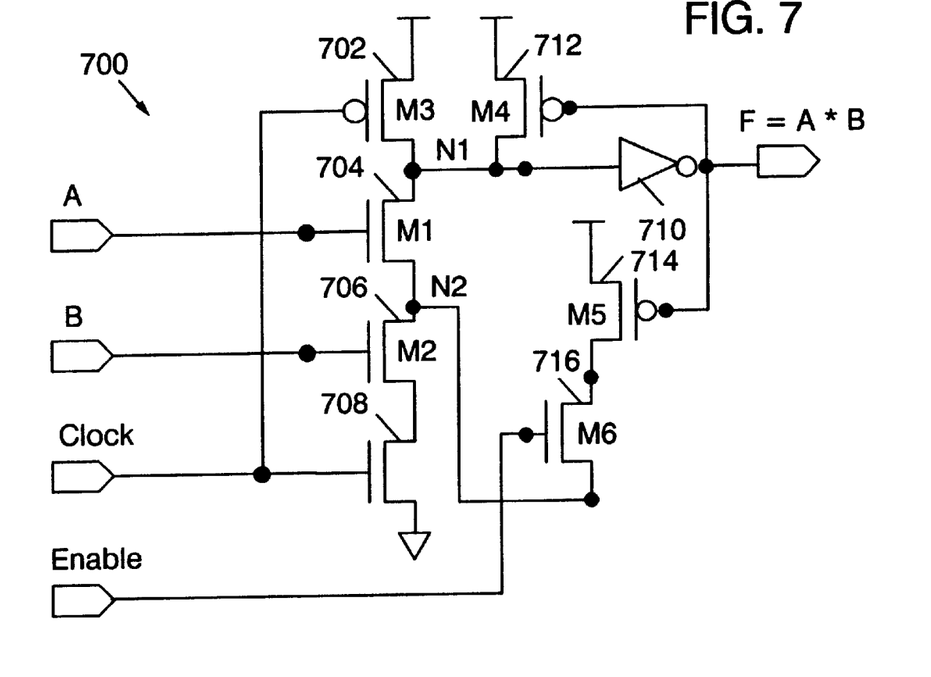
FIG. 7 illustrates, in circuit diagram form, a dynamic AND circuit in accordance with one embodiment of the present invention.

FIG. 7 illustrates an alternate embodiment of a dynamic AND circuit configured in accordance with one embodiment of the present invention. Dynamic AND circuit 700 comprises a transistor 702, a transistor 704, a transistor 706, a transistor 708, an inverter 710, a transistor 712, a transistor 714, and a transistor 716. In AND circuit 700, a first terminal of transistor 702 is coupled to a first reference voltage. A second terminal of transistor 702 is coupled to receive a clock signal. A third terminal of transistor 702 is coupled to a first terminal of transistor 704, a first terminal of transistor 712, and an input of inverter 710. A second terminal of transistor 704 is coupled to receive the A input signal. A third terminal of transistor 704 is coupled to a first terminal of transistor 706 and a first terminal of transistor 716. A second terminal of transistor 706 is coupled to receive the B input signal. A third terminal of transistor 706 is coupled to a first terminal of transistor 708. The clock signal is coupled to second terminal of transistor 708 and a third terminal of transistor 708 is coupled to a reference ground voltage. An enable signal is coupled to a second terminal of transistor 716 and a third terminal of transistor 716 is coupled to a first terminal of transistor 714. A second terminal of transistor 714 is coupled to the first reference voltage. A third terminal of transistor 714 is coupled to an output of inverter 710. A second terminal of transistor 712 is coupled to the output of inverter 710. A third terminal of transistor 712 is coupled to the first reference voltage. The output of inverter 710 provides an output signal having the value of: F=A*B. It should be noted that in one embodiment of the present invention, transistors 702, 712, and 714 are implemented as p-channel devices. Similarly, transistors 704, 706, 708, and 716 are implemented as n-channel devices.

Figure 9:
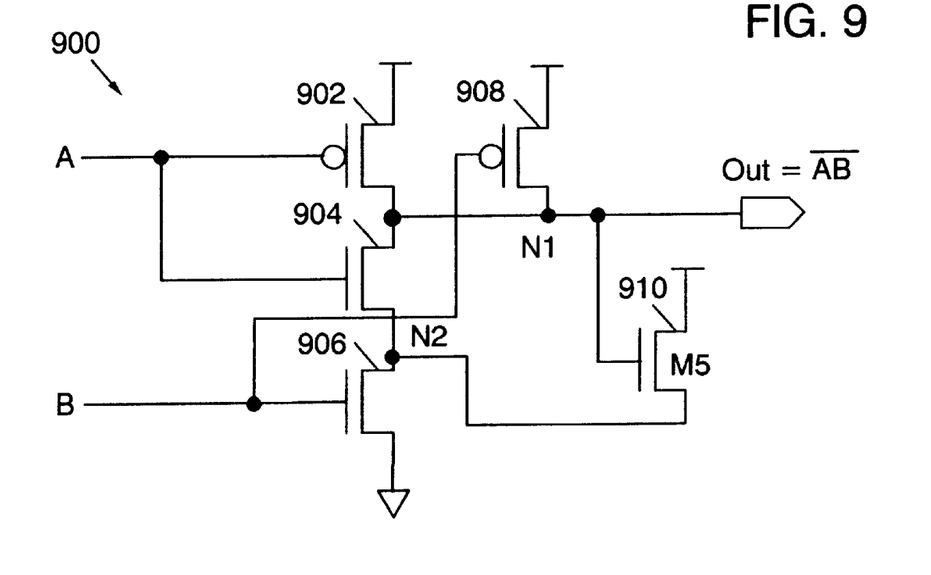
FIG. 9 illustrates, in circuit diagram form, an implementation of a static logic gate in accordance with one embodiment of the present invention.

FIG. 9 illustrates a static logic circuit which implements one embodiment of the present invention. The logic circuit which is implemented herein is a logical NOR circuit 900. NOR circuit 900 comprises a transistor 902, a transistor 904, a transistor 906, a transistor 908, and a transistor 910. A first terminal of transistor 902 is coupled to a first reference voltage. The A input signal is provided to a second terminal of transistor 902 and a first terminal of transistor 904. A third terminal of transistor 902 is coupled to a second terminal of transistor 904, a first terminal of transistor 908, and a first terminal of transistor 910. A third terminal of transistor 904 is coupled to a first terminal of transistor 906 and a second terminal of transistor 910. The B input signal is coupled to a second terminal of transistor 906 and a second terminal of transistor 908. A third terminal of transistor 906 is coupled to a reference ground voltage. Similarly, a third terminal of transistor 910 is coupled to the first reference voltage and a third terminal of transistor 908 is also coupled to the third reference voltage. It should be noted that node N1 is formed by the connection between the third terminal of transistor 902 and the first terminal of transistor 908. Similarly, Node N2 is formed by the connection between the first terminal of transistor 906 and the second terminal of transistor 910. An output signal provided at node N1 of NOR circuit 900 is: Out=$\overline{AB}$.

Figure 10:
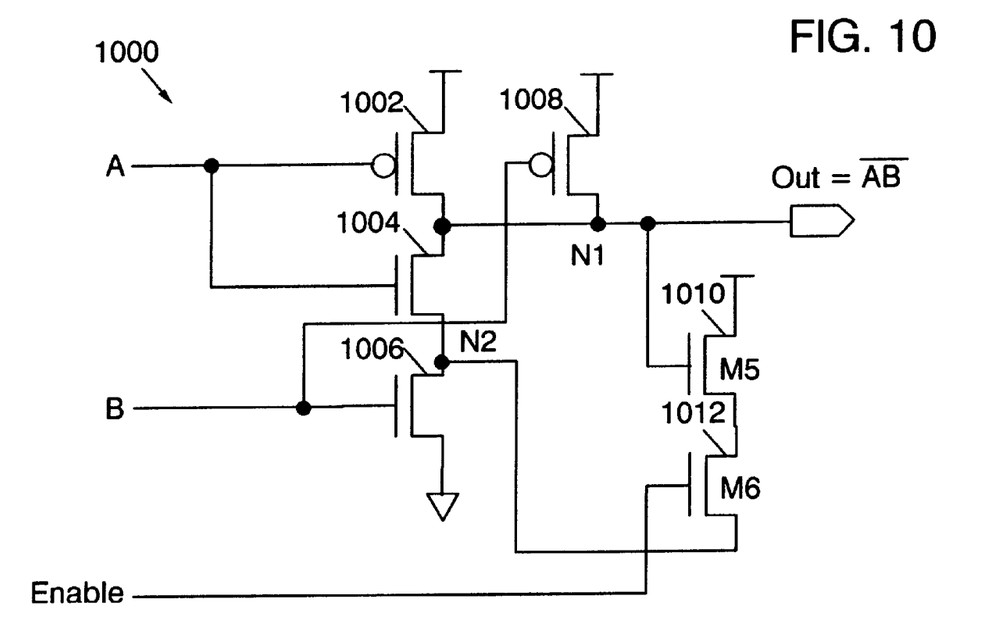
FIG. 10 illustrates, in circuit diagram form, an implementation of a static logic circuit in accordance with one embodiment of the present invention.

FIG. 10 illustrates an alternate embodiment of a static circuit implementing one embodiment of the present invention. NOR circuit 1000 comprises a transistor 1002, a transistor 1004, a transistor 1006, a transistor 1008, a transistor 1010, and a transistor 1012. A first terminal of transistor 1002 is coupled to a first reference voltage. The A input signal is coupled to a second terminal of transistor 1002 and a first terminal of transistor 1004. A third terminal of transistor 1002 is coupled to a second terminal of transistor 1004, a first terminal of transistor 1008, and a first terminal of transistor 1010. A third terminal of transistor 1004 is coupled to a first terminal of transistor 1006 and a first terminal of transistor 1012. The B input signal is coupled to a second terminal of transistor 1006 and a second terminal of transistor 1008. A third terminal of transistor 1006 is coupled to the ground reference voltage. A third terminal of transistor 1008 is coupled to the first reference voltage. An enable signal is provided to a second terminal of transistor 1012. A third terminal of transistor 1012 is coupled to a second terminal of transistor 1010. A third terminal of transistor 1010 is coupled to the first reference voltage. Furthermore, the third terminal of transistor 1002 is coupled to provide an output signal, labeled OUT. The OUT signal has the form of: $\overline{AB}$.

The connectivity of the present invention has been described in detail above. Subsequently, a more detailed description of operation of the circuits and methods implemented by the present invention will be provided.

Description of Operation

As has been previously described, there are many factors which should be considered in designing a circuit which may require the implementation of an anti-charge sharing device. The circuit which implements such an anti-charge sharing device in accordance with one embodiment of the present invention balances the functionality, noise sensitivity, and power requirements of the device to provide an efficient and useful design.

FIG. 6 illustrates a first embodiment of the present invention in which an anti-charge sharing device is implemented in a dynamic AND circuit 600. In FIG. 6, two devices, transistor 614 and transistor 616, form an anti-charge sharing device which protects node N1 from a charge share event related to node N2. Transistor 614 provides a constant re-enforcement of voltage on node N2. Transistor 614 is coupled to internal node N1, and has the characteristic that it will always be inactive, or negated, when node N1 is discharged to a logic low level. In this manner, the power drawn by the anti-charge sharing device of the present invention is substantially lower than the power drawn by AND circuit 500 of FIG. 5. Furthermore, data-dependent reset situations cannot occur in the configuration of the present invention illustrated in FIG. 6 because it is not possible to have an evaluation followed by a false pre-charge based on input data. Stated another way, a discharge of node N1 precludes a pull-up function by transistor 614. While the foregoing has provided a brief description of operation of the present invention, a more detailed description of circuit operations will be provided below.

In dynamic AND gate 600 of FIG. 6, the anti-charge sharing device formed by transistors 614 and 616 is not controlled by the clock signal as was required by prior art implementations. Rather, the anti-charge sharing device formed by transistors 614 and 616 is controlled by node N1. Because transistor 614 is controlled by node N1, transistor 614 will remain active as long as AND circuit 600 is in its pre-charged condition. Therefore, once AND circuit 600 has been prepared for evaluation, it is in a pre-charged condition and will be held in this pre-charge condition by transistor 612. It should be noted that transistor 612 is referred to as a half-latch. Additionally, transistor 614 will remain asserted to charge node N2 for an indefinite period of time. When node N2 is charged, node N1 is not able to be discharged by conduction through transistor 604, leakage into the substrate from node N2, or through node N2 due to leakage to transistor 606 resulting from noise on the B input signal. Furthermore, transistor 616 is an auxiliary transistor added for test purposes and is enabled during normal operation of AND circuit 600. Because transistor 616 is typically enabled during normal operation, transistor 614 performs the anti-charge sharing operations previously described. Therefore, it may be observed that the purpose of transistor 616 is to disable the anti-charge sharing device to avoid DC currents during test modes of operation.

For completeness, it should be noted that transistor 616 disables the anti-charge sharing device during many test modes, including an IDDQ test which looks for shorts in a data processor. Such IDDQ testing exploits the fact that CMOS circuits have zero DC current when they are not switching. However, this useful test is only effective if DC current paths are eliminated from all of the circuits. During operation, when AND circuit 600 is in its pre-charge condition and transistor 616 is enabled, a conduction path exists through transistor 612 because node N1 is asserted. Therefore, inverter 610 produces a logic low value of the output; thus, in turn, produces a logic low output at the gate of transistor 612. As transistor 612 is a p-channel device, N1 is driven to a logic high value at all times. Because node N1 is driven to a logic high value, transistor 614 is enabled to supply current through transistor 616. During this operation, node N2 will presumably stay charged even though the B input signal is asserted and the clock signal is in an evaluate phase. When the A input signal remains disabled, the B input signal is enabled, and the clock signal is in an evaluate stage, AND circuit 600 will draw DC current and obscure the results of an IDDQ test. Therefore, to have the IDDQ test work properly, the enable signal is negated to disable transistor 616 during a test mode of operation. It should be noted that the enable signal is a global signal provided by general test circuitry (not illustrated herein) built into a semiconductor device which implements an embodiment of the present invention. Additionally, the enable signal can be a primary input to the semiconductor device and provided by an external tester. It should be noted that the provision of an enable signal in this situation is well-known to those with skill in the art and will not be described in greater detail herein.

FIG. 7 illustrates an alternate embodiment of an AND circuit which implements the anti-charge sharing device of the present invention in greater detail. In implementing the anti-charge sharing device of FIG. 7, it should be noted that the anti-charge sharing device is coupled between an inverted representation of node N1 and a node to be protected from charge sharing. In this case, the output of inverter 710 is coupled to a gate of transistor 714. FIG. 7 illustrates a first embodiment of the present invention in which an anti-charge sharing device is implemented in a dynamic AND circuit 700. In FIG. 7, two devices, transistor 714 and transistor 716, form an anti-charge sharing device which protects node N1 from a charge share event related to node N2. Transistor 714 provides a constant re-enforcement of voltage on node N2. Transistor 714 is coupled to internal node N1, and has the characteristic that it will always be inactive, or negated, when node N1 is discharged to a logic low level. In this manner, the power drawn by the anti-charge sharing device of the present invention is substantially lower than the power drawn by AND circuit 500 of FIG. 5. Furthermore, data-dependent reset situations cannot occur in the configuration of the present invention illustrated in FIG. 7 because it is not possible to have an evaluation followed by a false pre-charge based on input data. Stated another way, a discharge of node N1 precludes a pull-up function by transistor 714. While the foregoing has provided a brief description of operation of the present invention, a more detailed description of circuit operations will be provided below.

In dynamic AND gate 700 of FIG. 7, the anti-charge sharing device formed by transistors 714 and 716 is not controlled by the clock signal as was required by prior art implementations. Rather, the anti-charge sharing device formed by transistors 714 and 716 is controlled by node N1. Because transistor 714 is a p-channel device that is controlled by node N1 through inverter 710, transistor 714 will remain active as long as AND circuit 700 is in its precharged condition. Therefore, once AND circuit 700 has been prepared for evaluation, it is in a pre-charged condition and will be held in this pre-charge condition by transistor 712. It should be noted that transistor 712 is referred to as a half-latch. Additionally, transistor 714 will remain asserted to charge node N2 for an indefinite period of time. When node N2 is charged, node N1 is not able to be discharged by conduction through transistor 704, leakage into the substrate from node N2, or through node N2 due to leakage to transistor 706 resulting from noise on the B input signal. Furthermore, transistor 716 is an auxiliary transistor added for test purposes and is enabled during normal operation of AND circuit 700. Because transistor 716 is typically enabled during normal operation, transistor 714 performs the anti-charge sharing operations previously described. Therefore, it may be observed that the purpose of transistor 716 is to disable the anti-charge sharing device to avoid DC currents during test modes of operation.

For completeness, it should be noted that transistor 716 disables the anti-charge sharing device during many test modes, including an IDDQ test which looks for shorts in a data processor. Such IDDQ testing exploits the fact that CMOS circuits have zero DC current when they are not switching. However, this useful test is only effective if DC current paths are eliminated from all of the circuits. During operation, when AND circuit 700 is in its pre-charge condition and transistor 716 is enabled, a conduction path exists through transistor 712 because node N1 is asserted. Therefore, inverter 710 produces a logic low value of the output; thus, in turn, produces a logic low output at the gate of transistor 712. As transistor 712 is a p-channel device, N1 is driven to a logic high value at all times. Because node N1 is driven to a logic high value, transistor 714 is enabled to supply current through transistor 716. During this operation, node N2 will presumably stay charged even though the B input signal is asserted and the clock signal is in an evaluate phase. When the A input signal remains disabled, the B input signal is enabled, and the clock signal is in an evaluate stage, AND circuit 700 will draw DC current and obscure the results of an IDDQ test. Therefore, to have the IDDQ test work properly, the enable signal is negated to disable transistor 716 during a test mode of operation. It should be noted that the enable signal is a global signal provided by general test circuitry (not illustrated herein) built into a semiconductor device which implements an embodiment of the present invention. Additionally, the enable signal can be a primary input to the semiconductor device and provided by an external tester. It should be noted that the provision of an enable signal in this situation is well-known to those with skill in the art and will not be described in greater detail herein.

FIGS. 9 and 10 illustrate implementations of the present invention in static circuits. It should be noted that it is also possible to create a charge share event in a static circuit and, therefore, the invention may be applied to static circuits, as well as the previously described dynamic circuits. While such charge share events occur in many static circuits, for the purposes of explanation, assume that a static circuit which is monotonic is being evaluated. When a monotonic static circuit evaluates, there is only one transition from a previous state to a new state. It should be noted that this type of static circuit is normally generated to include all of the product terms from a Karnough map to prevent what is referred to in the art as hazards or glitches in transitions in the circuits.

Charge share induced output glitches should be avoided. FIG. 9 illustrates a static logic circuit which performs a NAND logic function. In FIG. 9, transistor 910 prevents a charge share event from occurring between nodes N1 and N2 when the B input is a logic low value and the A input transitions from a logic low level to a logic high value. Such an event would typically cause a short duration drop in a voltage level of the output. Initially, in FIG. 9, node N1 drops due to the occurrence of charge share with node N2. Then, transistor 908 immediately restores node N1 to a logic high ($V_{DD}$) value to prevent the occurrence of charge share induced output glitches.

Similarly, FIG. 10 implements a static logic circuit which performs the same function as the NAND circuit illustrated in FIG. 9. However, the logic circuit of FIG. 10 implements transistor 1012 as a DC current control device. Transistor 1012 is similar to transistor 616 of FIG. 6 and terminates the DC current that exists when the A input is a logic low value and the B input is a logic high value.

The anti-charge sharing device of the present invention implements a continuous anti-charge sharing device which does not significantly adversely affect performance of a circuit. The present invention achieves this operation by controlling the operation of the anti-charge sharing device (transistor M5) such that the charge share protection is provided during an evaluate condition. When a circuit begins to switch to the evaluate condition, the current of this transistor (M5) is disabled so that there is a smaller performance penalty than that of prior art implementations. Each of the advantages described above is implemented without the addition of a significant amount of overhead.

Furthermore, the implementation of the invention described herein is provided by way of example only. However, many other implementations may exist for executing the function described herein. For example, since the techniques of the present invention are not clock dependent, the present invention may be applied to any precharge circuit with charge share problems, independent of a clocking scheme, including devices having pseudo clock dynamic timing, self-resetting dynamic timing and self-timed dynamic timing. Additionally, it should be understood that the present invention appears to other logic circuits and is not limited to the other logic functions described herein.

While there have been described herein the principles of the invention, it is to be clearly understood to those skilled in the art that this description is made by way of example only and not as a limited to the scope of the invention. Accordingly, it is intended, by the appended claims, to cover all modifications of the invention which fall within the true spirit and scope of the invention.

What is claimed is:

1. A circuit, comprising:

a dynamic logic circuit having an internal node and a pre-charge node;

a first transfer device having a first terminal directly connected without any intervening elements to a first reference value, a second terminal directly connected without any intervening elements to the internal node, and a third terminal; and a second transfer device having a first terminal directly connected without any intervening elements to the third terminal of the first transfer device, a second terminal directly connected without any intervening elements to an enable signal, and a third terminal directly connected without any intervening elements to the pre-charge node, wherein the dynamic logic circuit comprises:

a first transistor having a first terminal directly connected without any intervening elements to a second reference value, a second terminal directly connected without any intervening elements to a clock input signal, and a third terminal directly connected without any intervening elements to the internal node;

a second transistor having a first terminal directly connected without any intervening elements to the internal node, a second terminal directly connected without any intervening elements to a first input signal, and a third terminal directly connected without any intervening elements to the pre-charge node;

a third transistor having a first terminal directly connected without any intervening elements to the pre-charge node, a second terminal directly connected without any intervening elements to a second input signal, and a third terminal; and a fourth transistor having a first terminal directly connected without any intervening elements to the third terminal of the third transistor, a second terminal directly connected without any intervening elements to the clock input signal, and a third terminal directly connected without any intervening elements to a third reference value.

2. The circuit of claim 1 wherein the first transfer device comprises a transistor having a first electrode directly connected without any intervening elements to the first reference value, a gate electrode directly connected without any intervening elements to the internal node, and a second electrode.

3. The circuit of claim 2 wherein the first transfer device comprises a fifth transistor having a first electrode directly connected without any intervening elements to the first reference value, a second terminal directly connected without any intervening elements to the internal node, and a third electrode.

4. The circuit of claim 3 wherein the third electrode is directly connected without any intervening elements to the pre-charge node.

5. The circuit of claim 2, further comprising:

a feedback circuit having an input directly connected without any intervening elements to the internal node and an output.

6. The circuit of claim 5 wherein the first transfer device comprises a fifth transistor having a first terminal directly connected without any intervening elements to the first reference value, a second terminal directly connected without any intervening elements to the internal node, and a third terminal.

7. The circuit of claim 6 wherein the third terminal of the fifth transistor is directly connected without any intervening elements to the pre-charge node.

8. The circuit of claim 5 wherein the first transfer device comprises a fifth transistor having a first terminal directly connected without any intervening elements to the first reference value, a second terminal directly connected without any intervening elements to the output of the feedback circuit, and a third terminal.

9. The circuit of claim 2 wherein the first transfer device transfers the first current from the pre-charge node of the logic circuit when the internal node of the logic circuit is in a first logic state.

* * * * *